(12) United States Patent
Park

(10) Patent No.: US 6,880,039 B2
(45) Date of Patent: Apr. 12, 2005

(54) RAMBUS DYNAMIC RANDOM ACCESS MEMORY

(75) Inventor: Nak Kyu Park, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 189 days.

(21) Appl. No.: 10/238,186

(22) Filed: Sep. 10, 2002

(65) Prior Publication Data

US 2003/0056056 A1 Mar. 20, 2003

(30) Foreign Application Priority Data

Sep. 13, 2001 (KR) .......................................... 2001-56507

(51) Int. Cl.[7] .............................. G06F 12/00; G11C 7/22
(52) U.S. Cl. ........................ 711/105; 711/5; 365/189.09
(58) Field of Search .............................. 711/5, 104, 105, 711/152, 172; 365/189.01, 189.08, 227

(56) References Cited

U.S. PATENT DOCUMENTS 6,138,202 A * 10/2000 Nilsen .......................... 711/101
6,362,995 B1 * 3/2002 Moon et al. .................... 365/51
6,507,886 B1 * 1/2003 Chen et al. ...................... 711/5
6,535,450 B1 * 3/2003 Ryan et al. ............. 365/230.03

OTHER PUBLICATIONS

Derwent Acc. No. 2002–412263, Park N G, KR 2001109645 A, Dec. 2001, 3 pages.*

* cited by examiner

*Primary Examiner*—Gary Portka
(74) *Attorney, Agent, or Firm*—Ladas & Parry LLP

(57) ABSTRACT

Disclosed is a Rambus DRAM capable of reducing power consumption and layout area by enabling data read/write control signal of accessed memory bank only, in a top memory bank and a bottom memory bank. The disclosed comprises: a top and a bottom memory bank blocks including a plurality of unit memory banks, respectively; and a data read/write control signal generation block for generating a top data write control signal and a top data read control signal to the top memory bank block and a bottom data write control signal and a bottom data read control signal to the bottom memory bank block, thereby controlling the top memory bank block and the bottom memory bank block to separately operate in data read/write operations.

18 Claims, 11 Drawing Sheets

RAMBUS DYNAMIC RANDOM ACCESS MEMORY

BACKGROUND OF THE INVENTION

1. Field of the Invention

The present invention relates to Rambus DRAM and, more particularly, to Rambus DRAM capable of reducing power consumption and layout area by enabling data read/write control signal of accessed memory bank only, in a top memory bank and a bottom memory bank.

2. Description of Related Art

FIG. 1 is a block diagram of conventional Rambus DRAM. Referring to FIG. 1, the Rambus DRAM comprises a top memory bank block 1 and a bottom memory bank block 4 comprising a plurality of memory banks, respectively and data read/write control signal generation block 7 for generating data read/write control signal to the top and bottom memory bank blocks 1,4.

The top memory bank block 1 includes a DQA memory bank block 2 comprising 9 unit memory banks S1–S9 controlled by data signal received through data input/output pin DQA and a DQB memory bank block 3 comprising 9 unit memory banks S1–S9 controlled by data signal received through DQB pin.

The bottom memory bank block 4 includes a DQA memory bank block 5 comprising 9 unit memory banks S1–S9 controlled by data signal received through DQA pin and a DQB memory bank block 6 comprising 9 unit memory banks S1–S9 controlled by data signal received through DQB pin.

The data read/write control signal generation block 7 of FIG. 1 generates data write control signal writeD0123, write D4567 to 36 unit memory banks of top and bottom memory bank blocks 1, 4 in data write operation to enable them at the same time. And, in data read operation, the data read/write control signal generation block 7 generates data read control signal loadRDpipe to 36 unit memory banks of top and bottom memory bank blocks 1, 4 to enable all of them at the same time. As a result, the conventional Rambus DRAM has a problem of excessive power consumption.

FIG. 2A is a data write transmission circuit diagram controlled by data write control signal writeD0123 of each unit memory bank in FIG. 1, comprising 4 latch units 11 and 1 control unit 12.

The 4 latch units 11 latch data received through input pad (not shown) and then, transmits the data to memory cell (not shown) and the control unit 12 receives write data control signal writeD0123 and then, generates signal controlling operation of the 4 latch units 11.

FIG. 2B is a data write transmission circuit diagram controlled by data write control signal writeD4567 of each memory bank in FIG. 1, comprising 8 latch units 13 and 1 control unit 14.

The 8 latch units 13 latch data received through pad (not shown) and then, transmits the data to memory cell (not shown) and the control unit 14 receives data write control signal writeD4567 and then, generates signal controlling operation of the 8 latch units 13.

FIG. 3A is a data read transmission circuit diagram controlled by data read control signal loadRDpip of each memory bank in FIG. 1, comprising 8 latch units 15 and 1 control unit 16.

The 8 latch units 15 transmit data received from memory cell (not shown) to pad (not shown) and the control unit 16 receives data read control signal loadRDpipe to generate signal controlling operation of the 8 latch units 15.

FIG. 3B is a data read transmission circuit diagram controlled by data read control signal drainRDpipe of each memory bank in FIG. 1, comprising 8 latch units 17 and 1 control unit 16.

The 8 latch unit 17 transmits data received from memory cell (not shown) to pad (not shown) and the control unit 16 receives data read control signal drainRDpipe to generate signal controlling operation of the 8 latch units 17.

FIG. 4A is a waveform of conventional data write control signal comprising an external clock rclk, a top memory enable clock sclk_en_top, a bottom memory enable clock sclk_en_bot, a pre data write signal writeD0123_pre, a pre data write signal writeD4567_pre, a data write control signal writeD0123 and a data write control signal writeD4567.

In the data write control signal writeD0123 and the data write control signal writeD4567, a first clock is a signal for operating the top memory bank and a second clock is a signal for operating the bottom memory bank. The top and the bottom memory banks are simultaneously operated by the data write control signal writeD0123 and the data write control signal writeD4567 in the section overlapped by the top memory enable clock sclk_en_top and the bottom memory enable clock sclk_en_bot.

FIG. 4B is a circuit diagram of conventional data write control signal generation circuit, showing a data write control signal writeD0123 generation block 21 and a data write control signal writeD4567 generation block 23.

The data write control signal writeD0123 generation block 21 comprises a first pre data write generation block 22 and two inverters 23,24 connected in a series. The first pre data write generation block 22 generates a pre data write signal writeD0123_pre and two inverters 23,24 receives the pre data write signal writeD0123_pre to generate a data write control signal writeD0123.

The data write control signal writeD4567 generation block 25 comprises a second pre data write generation block 26 and two inverters 27,28 connected in a series. The second pre data write generation block 26 generates a pre data write signal writeD4567_pre and the two inverters 27,28 receives the pre data write signal writeD4567_pre to generate a data write control signal writeD4567.

FIG. 5A is a waveform of conventional data read control signal loadRDpipe comprising an external clock rclk, a pre data read signal loadRDpipe_pre and a data read control signal loadRDpipe. The data read control signal loadRDpipe includes a clock signal for accessing top and bottom memory banks in the sections 8-c of external clock rclk.

FIG. 5B is a diagram of conventional data read control signal loadRDpipe generation circuit comprising a pre data read generation block 31 and two inverters 32,33 connected in a series.

The pre data read generation block 31 generates a pre data read signal loadRDpipe_pre and the two inverters 32,33 receives the pre data write signal loadRDpipe_pre to generate a data read control signal loadRDpipe.

FIG. 5C is a waveform of conventional data read control signal drainRDpipe comprising an external clock rclk, a domain control block signal load_out, a top bank selection signal top_bank_sel, a bottom bank selection signal bot_bank_sel, a bottom data read clock signal load_outpipe_bot, a top data read clock signal load_outpipe_top, a bottom data read control signal drainRDpipe_bot and a top data read control signal drainRDpipe_top.

The bottom data read control signal drainRDpipe_bot is generated by the bottom data read clock signal load_outpipe_bot and the top data read control signal drainRDpipe_top is generated by the top data read clock signal load_outpipe_top.

The bottom data read clock signal load_outpipe_bot and the top data read clock signal load_outpipe_top are generated by the domain control block signal load_out.

FIG. 5D is a diagram of conventional data read control signal drainRDpipe generation circuit comprising a top data read control signal drainRDpipe_top generation circuit unit 40 including a domain control unit 41, two inverters 42,43 and a top data read control signal generation block 44, and a bottom data read control signal drainRDpipe_bot generation circuit unit 50 including a domain control unit 51, two inverters 52,53 and a top data read control signal generation block 54.

The top data read control signal drainRDpipe_top generation circuit unit 40 comprises a domain control unit 41 for receiving a domain control block signal load_out by a top bank selection signal top_bank_sel and outputting a pre data read clock signal load_outpipe_pre, two inverters 42, 43 connected in a series for receiving the output signal load_outpipe_pre of the domain control unit 41 and outputting a top data read clock signal load_outpipe_top and a top data read control signal generation block 44 for receiving an output signal load_outpipe_top of the inverter 43 and outputting a top data read control signal drainRDpipe_top.

The bottom data read control signal drainRDpipe_bot generation circuit unit 50 comprises a domain control unit 51 for receiving a domain control block signal load_out by a bottom bank selection signal bot_bank_sel and outputting a pre data read clock signal load_outpipe_pre, two inverters 52,53 connected in a series for receiving an output signal load_outpipe_pre of the domain control unit 51 and outputting a bottom data read clock signal load_outpipi_bot and a bottom data read control signal generation block 54 for receiving an output signal load_outpipe_bot of the inverter 53 and outputting a bottom data read control signal drainRDpipe_bot.

However, the conventional Rambus DRAM has a problem of excessive power consumption since data write control signals writeD0123, writeD4567 are toggled, thereby simultaneously operating data write path of top and bottom memory banks in writing data to the top memory bank and data read control signal loadRDpipe is toggled, thereby simultaneously operating data read path of top and bottom memory banks in reading data of the top memory bank block.

And, the conventional data read control signal drainRDpipe path is operated by dividing top and bottom memory banks. In this case, the data read control signal drainRDpipe is generated by each block path and the domain control unit has a complicated circuit structure, thereby increasing power consumption and layout area.

SUMMARY OF THE INVENTION

Therefore, the present invention has been proposed to solve the above-mentioned problems and the primary objective of the present invention is to provide a Rambus DRAM capable of reducing power consumption and optimizing layout area by enabling data read/write control signal of only accessed memory bank in the top memory bank and the bottom memory bank.

In order to accomplish the above objective, the present invention comprises: a top and a bottom memory bank blocks including a plurality of unit memory banks, respectively; and a data read/write control signal generation block for generating a top data write control signal and a top data read control signal to the top memory bank block and a bottom data write control signal and a bottom data read control signal to the bottom memory bank block, thereby separately operating the top memory bank block and the bottom memory bank block in data read/write operations.

As described above, according to the present invention, data write control signals writeD0123, writeD4567 and data read control signal loadRDpipe enable only accessed memory bank in a top and a bottom memory banks, thereby reducing power consumption. And, it is possible to simplify a domain control block in the data read control signal drainRDpipe path. Moreover, the present invention has an advantage of reducing power consumption and layout area by employing one block of data read control signal loadRDpipe.

DETAILED DESCRIPTION OF THE INVENTION

The above objects, and other features and advantages of the present invention will become more apparent after reading the following detailed description when taken in conjunction with the drawings.

Figure 1:
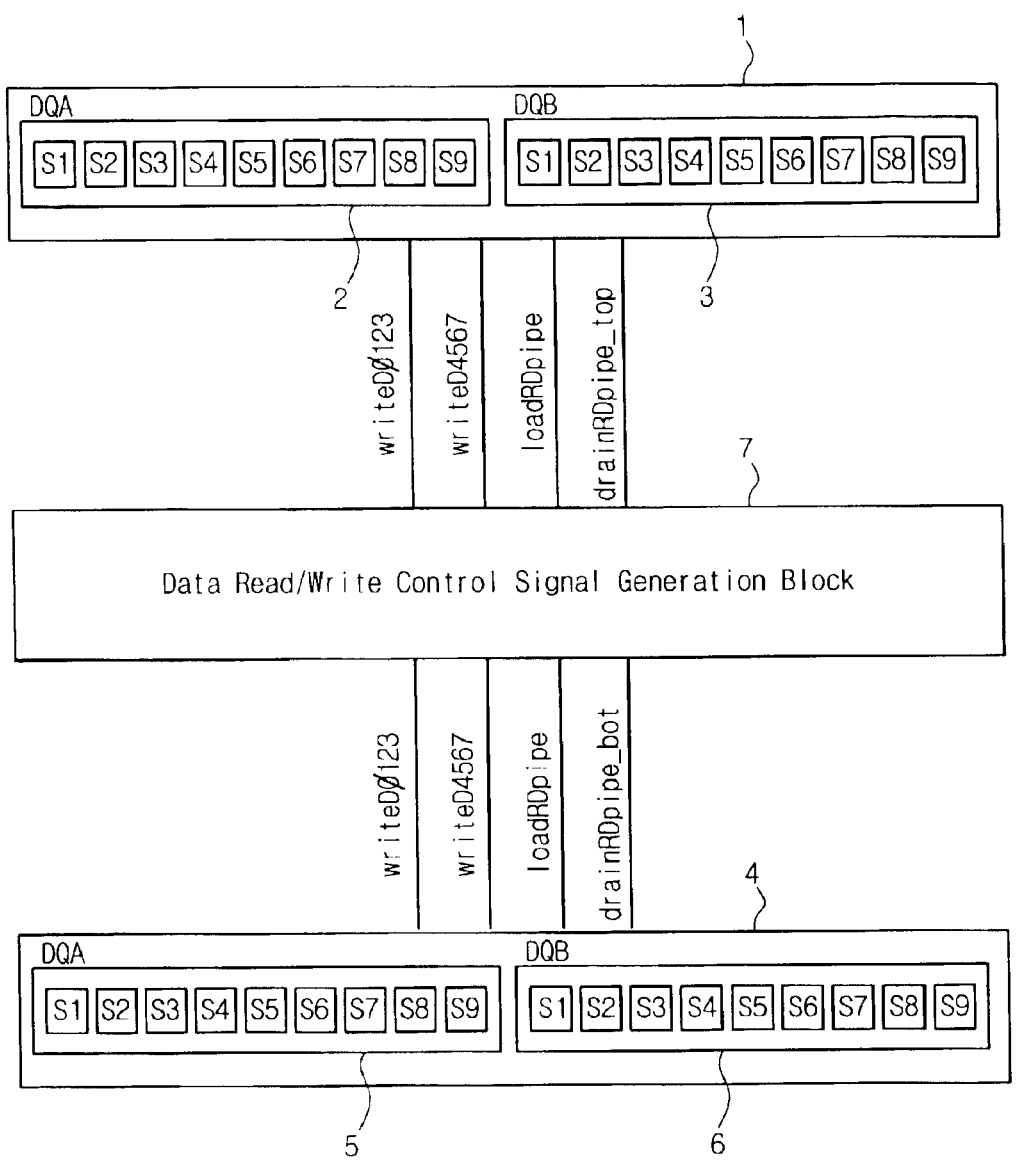
FIG. 1 is a block diagram of conventional Rambus DRAM.
Figure 2A:
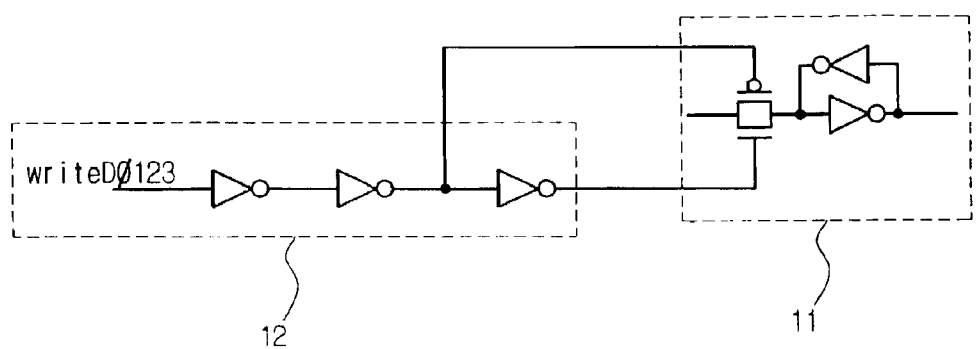
FIG. 2A is a data write transmission circuit diagram controlled by a data write control signal writeD0123 of each memory bank in FIG. 1.
Figure 2B:
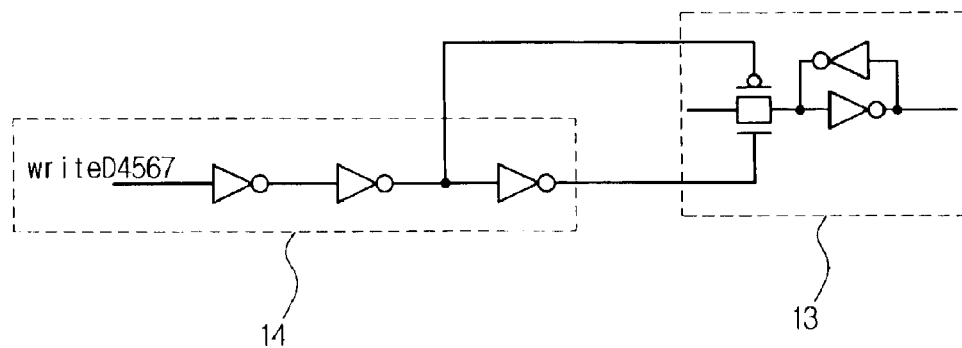
FIG. 2B is a data write transmission circuit diagram controlled by a data write control signal writeD4567 of each memory bank in FIG. 1.
Figure 3A:
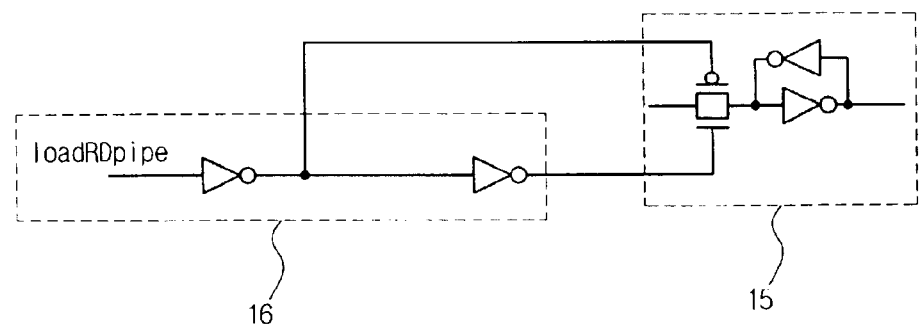
FIG. 3A is a data read transmission circuit diagram controlled by a data read control signal loadRDpip of each memory bank in FIG. 1.
Figure 3B:
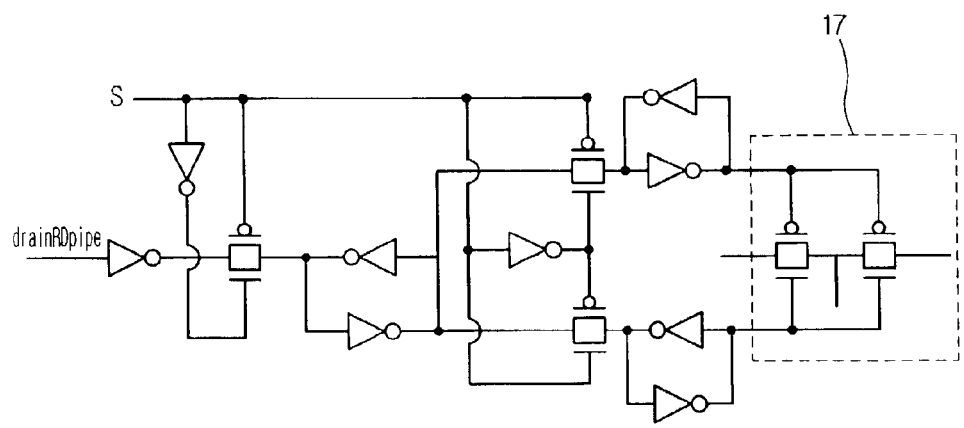
FIG. 3B is a data read transmission circuit diagram controlled by a data read control signal drainRDpipe of each memory bank in FIG. 1.
Figure 4A:
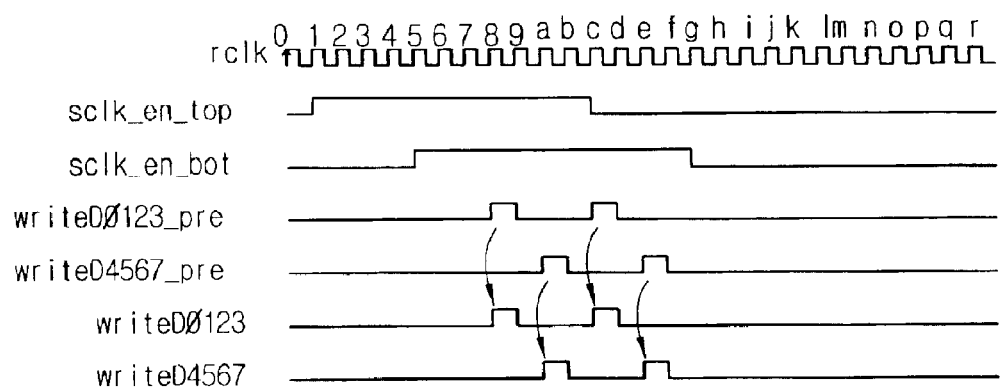
FIG. 4A is a waveform of conventional data write control signal.
Figure 4B:
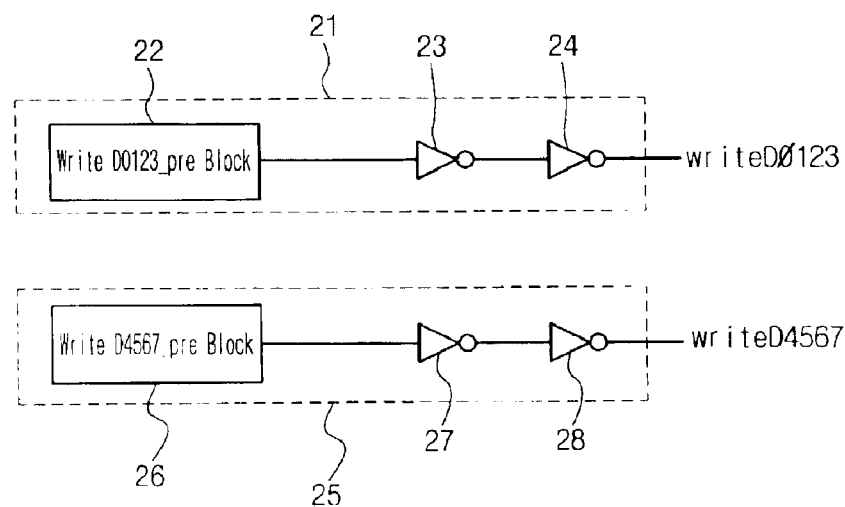
FIG. 4B is a diagram of conventional data write control signal generation circuit.
Figure 5A:
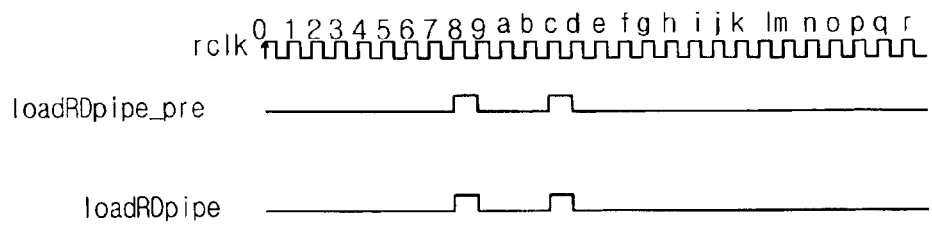
FIG. 5A is a waveform of conventional data read control signal loadRDpipe.
Figure 5B:
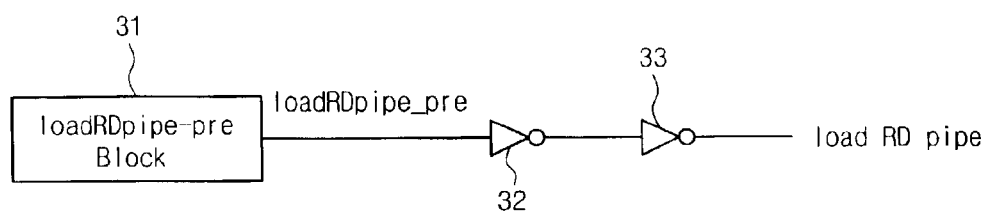
FIG. 5B is a diagram of conventional data read control signal loadRDpipe.
Figure 5C:
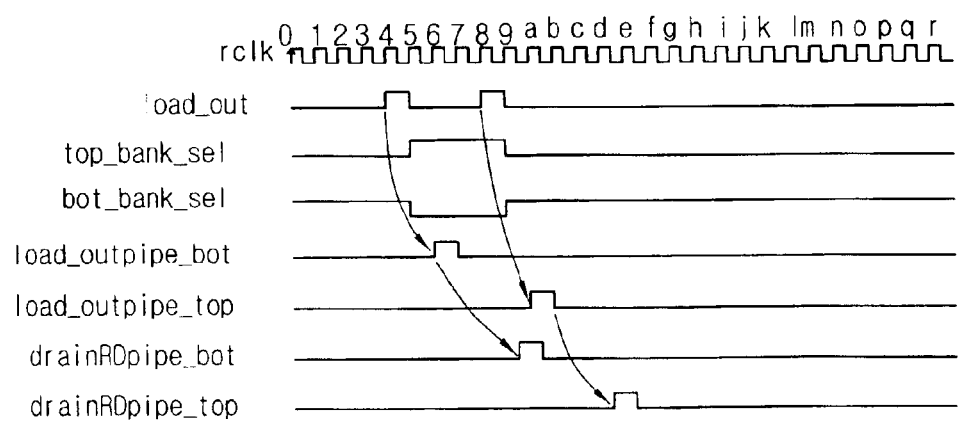
FIG. 5C is a waveform of conventional data read control signal drainRDpipe.
Figure 5D:
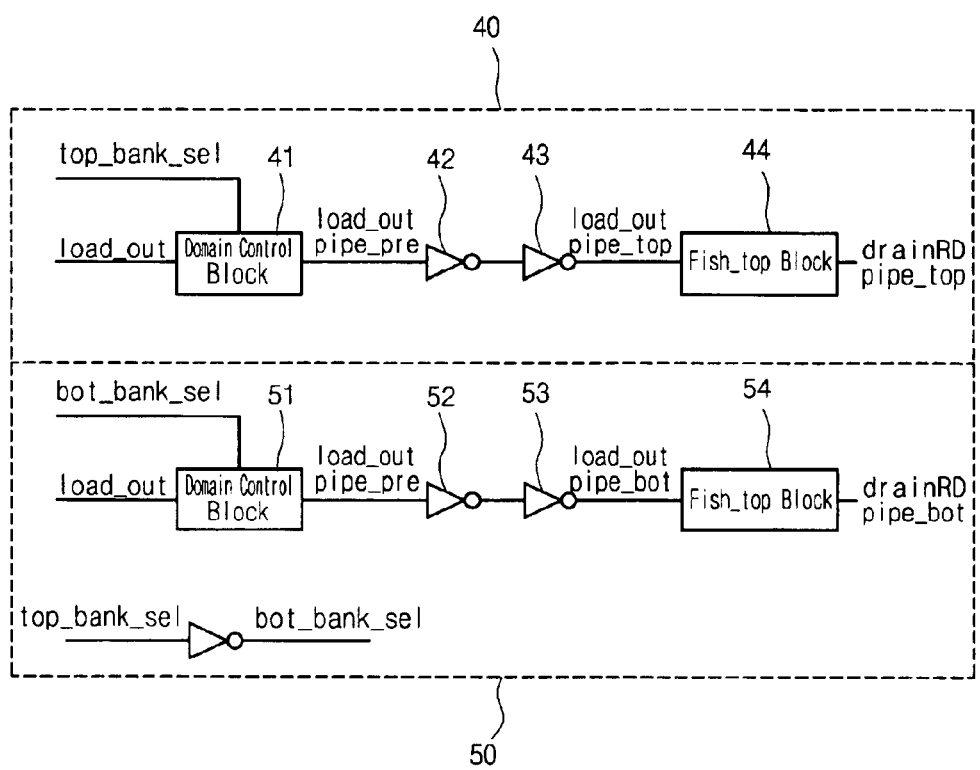
FIG. 5D is a diagram of conventional data read control signal drainRDpipe.
Figure 6:
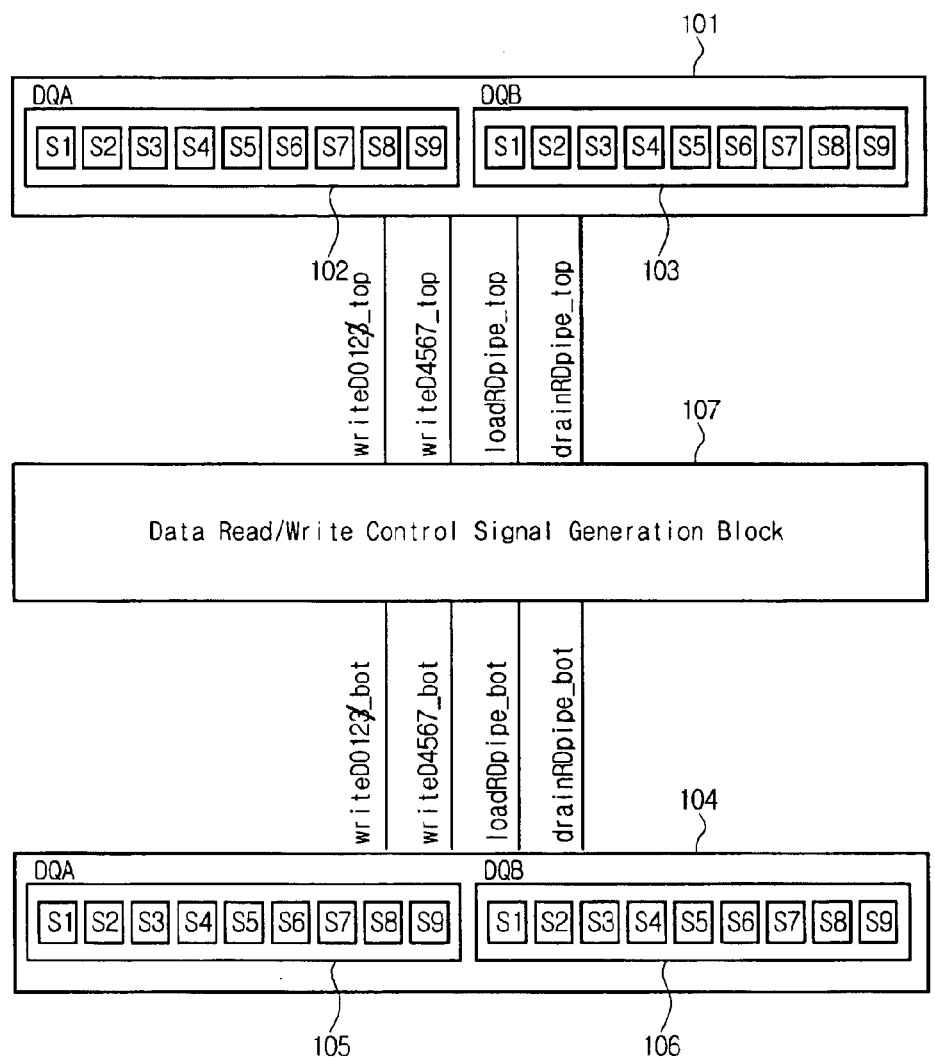
FIG. 6 is a block diagram of Rambus DRAM according to the present invention.

FIG. 6 is a block diagram of Rambus DRAM according to the present invention, comprising a top memory bank block 101 and a bottom memory bank block 104 (each memory bank block 101, 104 including a plurality of memory banks) and a data read/write control signal generation block 107. The data read/write control signal generation block 107 generates top data write control signals writeD0123_top, writeD4567_top and top data read control signals loadRDpipe_top, drainRDpipe_top to the top memory bank block 101. Similarly, the data read/write control signal generation block 107 generates bottom data write control signals writeD0123_bot, writeD4567_bot and bottom data read control signals loadRDpipe_bot, drainRDpipe_bot to the bottom memory bank block 104. This arrangement allows the data read/write control signal generation block 107 to selectively operate one of the top memory bank block 101 and the bottom memory bank block 104 in data read/write operations.

The top memory bank block 101 comprises a DQA memory bank block 102 including 9 unit memory banks S1–S9 controlled by data signal received through data input/output pin DQA and a DQB memory bank block 103 including 9 unit memory banks S1–S9 controlled by data signal received through DQB pin.

The bottom memory bank block 104 also comprises a DQA memory bank block 105 including 9 unit memory banks S1–S9 controlled by data signal received through DQA pin and a DQB memory bank block 106 including 9 unit memory banks S1–S9 controlled by data signal received through DQB pin.

The Rambus DRAM of the present invention operates data write/read path of only top memory bank block 101 in accessing memory cell of top memory bank block 101 and operates data write/read path of only bottom memory bank block 104 in accessing memory cell of bottom memory bank block 101. Therefore, conventional data write control signal writeD0123 is divided into a top data write control signal writeD0123_top and a bottom data write control signal writeD0123_bot to separately operate the top memory bank block 101 and the bottom memory bank block 104.

Figure 7A:
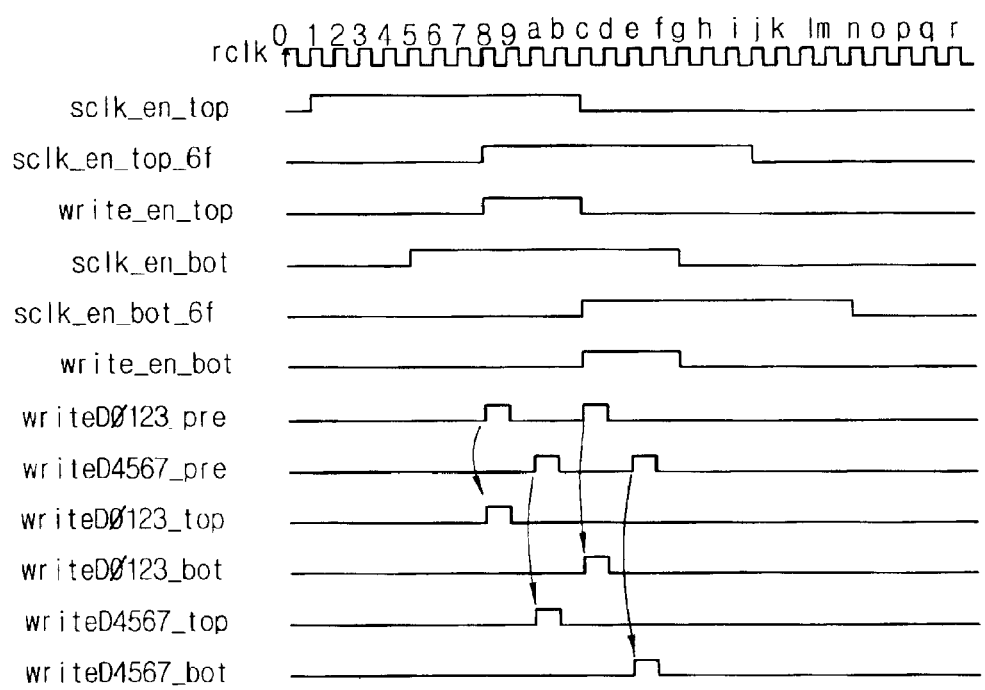
FIG. 7A is a waveform of data write control signal according to the present invention.

FIG. 7A is a waveform of data write control signal according to the present invention, wherein data writing is performed on the top memory bank block 101 and then, on the bottom memory bank block 104.

As shown in FIG. 7A, a top data write control signal writeD0123_top is generated in the 'high' section of top write clock signal sclk_en_top enabled in writing command of top memory bank block 101 at the time that a top write enable signal write_en_top is enabled to 'high', and a bottom data write control signal writeD0123_bot is generated in the 'high' section of bottom write clock signal sclk_en_bot at the time that a bottom write enable signal write_en_bot is enabled to 'high'. A top data write control signal writeD4567_top is generated one cycle of clock rclk after the top data write control signal writeD0123_top is generated and a bottom data write control signal writeD4567_bot is generated one cycle of clock rclk after the bottom data write control signal writeD0123_bot is generated.

That is, conventional data write control signals writeD0123_pre, writeD4567_pre are separated by using top write clock signal sclk_en_top and bottom write clock signal sclk_en_bot, thereby generating the top data write control signals writeD0123_top, writeD4567_top and the bottom data write control signals writeD0123_bot, writeD4567_bot.

When the top and the bottom write clock signals sclk_en_top, sclk_en_bot are used as it is, the top and bottom are operated at the same time in the section overlapped by top write clock signal sclk_en_top and bottom write clock signal sclk_en_bot as in the conventional Rambus DRAM. In order to solve the problem, a top data write enable signal write_en_bot and a bottom data write enable signal write_en_bot are generated by using flip flop and 2 input NAND gate as shown in FIG. 7C, and enabled only in the section that a data write control signal writeD0123 accesses top or bottom memory bank.

In FIG. 7A, a first pulse section of data write control signal writeD0123_pre (8–9 section from clock) and a first pulse section of data write control signal writeD4567_pre are data write control signals accessing top memory bank and second pulses of them are data write control signals accessing bottom memory bank.

In addition to the waveform in FIG. 7A, when the top memory bank is accessed after bottom memory bank or access is not performed successively, only accessed control signal is operated, thereby remarkably reducing power consumption.

Figure 7B:
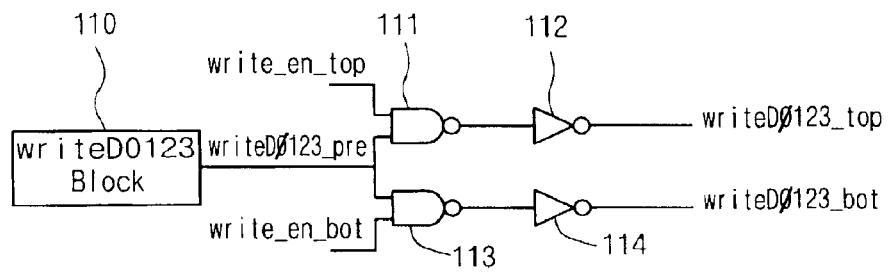
FIG. 7B is a diagram of data write control signal generation circuit according to the present invention.
Figure 7B:
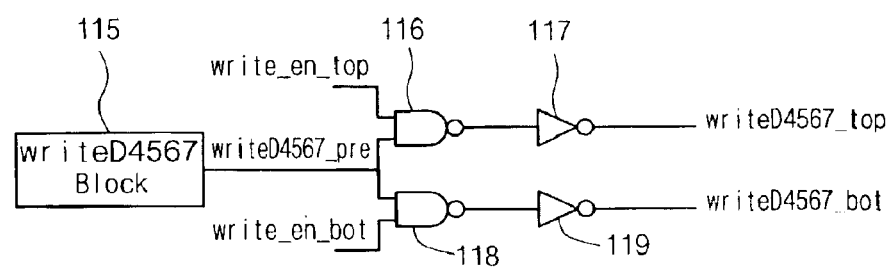
Figure 7C:
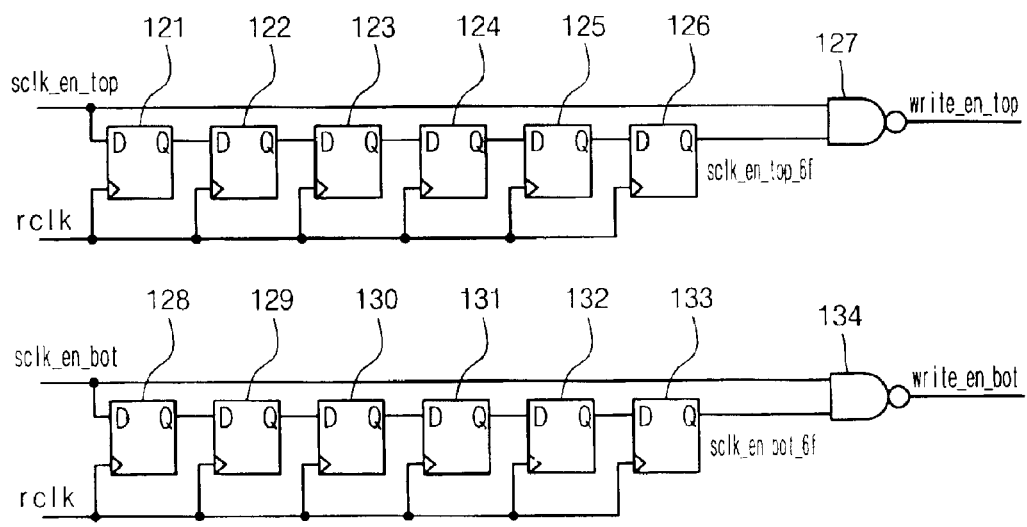
FIG. 7C is a diagram of data write enable signal generation circuit according to the present invention.

FIG. 7B is a diagram of data write control signal generation circuit according to the present invention, comprising: a NAND gate 111 for 2 input of top data write enable signal write_en_top and data write control signal writeD0123_pre; an inverter 112 for inverting output signal of the NAND gate 111 and generating a top data write control signal writeD0123_top; a NAND gate 113 for 2 input of bottom data write enable signal write_en_bot and the data write control signal writeD0123_pre; and an inverter 114 for inverting output signal of the NAND gate 113 and generating a bottom data write control signal writeD0123_bot. And, it further comprises; a NAND gate 116 for 2 input of top data write enable signal write_en_top and data write control signal writeD4567_pre; an inverter 117 for inverting output signal of the NAND gate 116 and generating a top data write control signal writeD4567_top; a NAND gate 118 for 2 input of bottom data write enable signal write_en_bot and the data write control signal writeD4567_pre; and an inverter 119 for inverting output signal of the NAND gate 118 and generating a bottom data write control signal writeD4567_bot.

FIG. 7C is a diagram of data write enable signal generation circuit according to the present invention, comprising: a flip flop 121 for inputting a top write clock signal sclk_en_top and a clock signal rclk; a flip flop 122 for inputting output signal of the flip flop 121 and the clock signal rclk; a flip flop 123 for inputting output signal of the flip flop 122 and the clock signal rclk; a flip flop 124 for inputting output signal of the flip flop 123 and the clock signal rclk; a flip flop 125 for inputting output signal of the flip flop 124 and the clock signal rclk; a flip flop 126 for inputting output signal of the flip flop 125 and the clock signal rclk; and a NAND gate 127 for 2 input of the top write clock signal sclk_en_top and output signal of the flip flop 126 sclk_en_top_6f to generate a top data write enable signal write_top. And, it further comprises: a flip flop 128 for inputting a bottom write clock signal sclk_en_bot and a clock signal rclk; a flip flop 129 for inputting output signal of the flip flop 128 and the clock signal rclk; a flip flop 130 for inputting output signal of the flip flop 129 and the clock signal rclk; a flip flop 131 for inputting output signal of the flip flop 130 and the clock signal rclk; a flip flop 132 for inputting output signal of the flip flop 131 and the clock signal rclk; a flip flop 133 for inputting output signal of the flip flop 132 and the clock signal rclk; and a NAND gate 134 for 2 input of the bottom write clock signal sclk_en_bot and output signal of the flip flop 133 to generate a bottom data write enable signal write_bot.

The operation and structure of data read control signal will be described with accompanying drawings 8A to 8E.

Figure 8A:
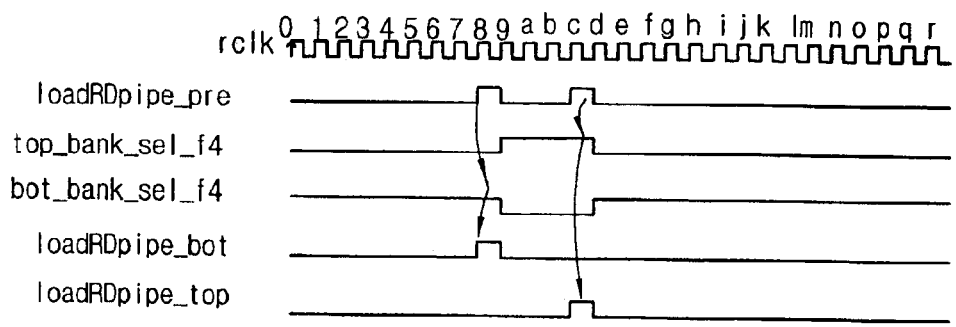
FIG. 8A is a waveform of data read control signal loadRDpipe according to the present invention.

FIG. 8A is a waveform of data read control signal loadRDpipe according to the present invention, wherein data of bottom memory bank is read after data of top memory bank is read.

The conventional data read control signal loadRDpipe is separated by using bottom bank selection signal bot_bank_sel_4f and top bank selection signal top_bank_sel_4f, thereby generating bottom data read control signal loadRDpipe_bot and top data read control signal loadRDpipe_top.

Figure 8B:
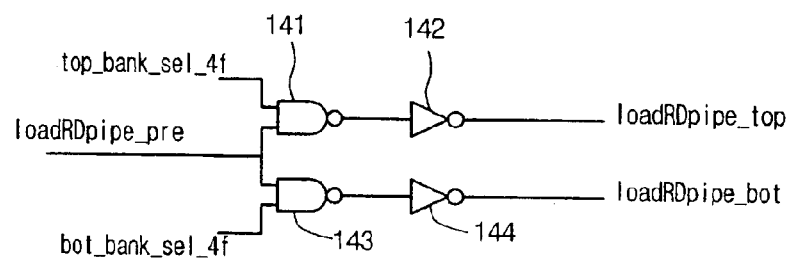
FIG. 8B is diagram of data read control signal loadRDpipe generation according to the present invention.
Figure 8C:
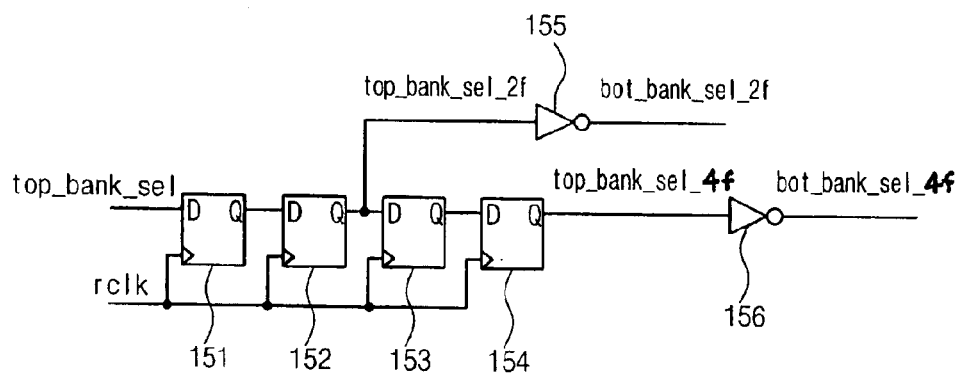
FIG. 8C is a diagram of top and bottom bank selection signal generation circuit in FIG. 8B.

Referring to FIG. 8C, top bank selection signal top_bank_sel_4f and bottom bank selection signal bot_bank_sel_4f are generated by using flip flop and inverter and enabled only in the section that the data read control signal loadRDpipe accesses top or bottom.

In FIG. 8A, a first pulse section of conventional data read control signal loadRDpipe (8–9 section from clock signal) is a data read control signal accessing bottom memory bank and a second pulse section (c-d section from clock signal) is a data read control signal accessing top memory bank.

FIG. 8B is a diagram of data read control signal loadRDpipe generation circuit, comprising: a NAND gate 141 for 2 input of top bank selection signal top_bank_sel_4f and data read control signal loadRDpipe_pre; an inverter for inverting output signal of the NAND gate 141 and generating a top data read control signal loadRDpipe_top; a NAND gate 143 for 2 input of bottom bank selection signal bot_bank_sel_4f and data read control signal loadRDpipe_pre; and an inverter 144 for inverting output signal of the NAND gate 143 and generating a bottom data read control signal loadRDpipe_bot.

FIG. 8C is a diagram of top and bottom bank selection signal generation circuit in FIG. 8B, comprising: a flip flop 151 for inputting a top bank selection signal top_bank_sel and a clock signal rclk; a flip flop 152 for inputting output signal of the flip flop and the clock signal rclk; a flip flop 153 for inputting output signal of the flip flop 152 and the clock signal rclk; a flip flop 154 for inputting output signal of the flip flop 153 and the clock signal rclk to generate a top bank selection signal top_bank_sel_f4; an inverter156 for inputting the top bank selection signal top bank sel f4 outputted from the flip flop 154 and generating a bottom bank selection signal bot_bank_sel_f4; and an inverter 155 for inputting the top bank selection signal top_bank_sel_2f outputted from the flip flop 152 and generating a bottom bank selection signal bot_bank_sel_2f.

Figure 8D:
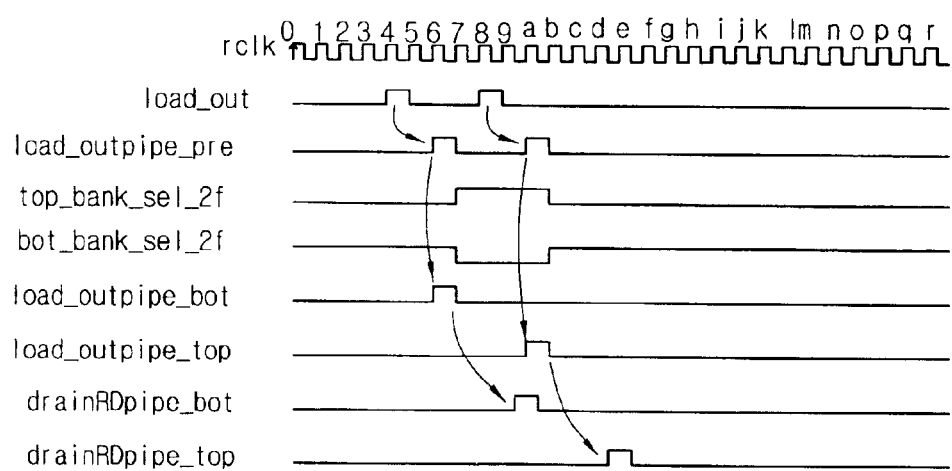
FIG. 8D is a waveform of data read control signal drainRDpipe according to the present invention.

FIG. 8D is a waveform of data read control signal drainRDpipe according to the present invention, wherein a bottom data read control signal drainRDpipe_bot is generated by the bottom data read clock signal load_outpipe_bot and the top data read control signal drainRDpipe_top is generated by the data read clock signal load_outpipe_top. And, the bottom data read clock signal load_output_bot and the top data read clock signal load_outpipe_top are generated by the domain control block signal load_out.

Figure 8E:
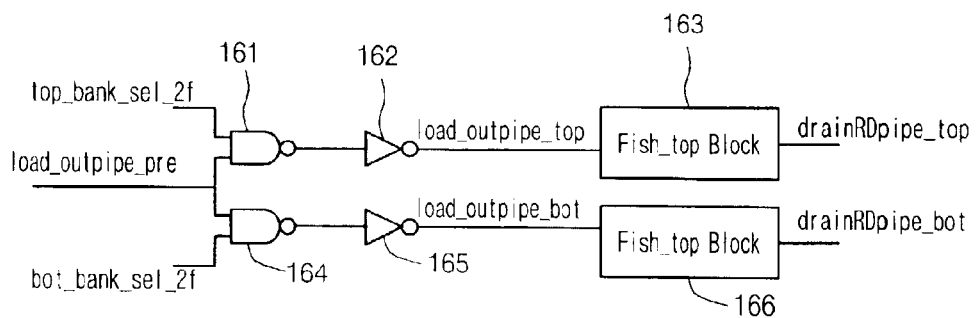
FIG. 8E is a diagram of top and bottom data read control signal generation circuit according to the present invention.

FIG. 8E is a diagram of top and bottom data read control signals drainRDpipe_top, drainRDpipe_bot generation circuit according to the present invention, comprising: a NAND gate for 2 input of top bank selection signal top_bank_sel_2f and data read clock signal load_outpipe_pre; an inverter 162 for receiving output signal of the NAND gate 161 and outputting the top data read clock signal load_outpipe_top; a top data read control signal generation block 163 for receiving the top data read clock signal load_outpipe_top outputted from the inverter 162 and generating a top data read control signal drainRDpipe_top; a NAND gate 164 for 2 input of bottom bank selection signal bot_bank_sel_2f and data read clock signal load_outpipe_pre; an inverter 165 for receiving output signal of the NAND gate 164 and outputting the bottom data read clock signal load_outpipe_bot; and a bottom data read control signal generation block 166 for receiving the bottom data read clock signal outputted from the inverter 165 and generating a bottom data read control signal drainRDpipe_bot.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A Rambus DRAM comprising:
   a top and a bottom memory bank blocks, each including a plurality of unit memory banks; and
   a Rambus DRAM data read/write control signal generation block for generating
      a top data write control signal independent of a bottom data write control signal and
      a top data read control signal to the top memory bank block and
      the bottom data write control signal independent of the top data write control signal and
      a bottom data read control signal to the bottom memory bank block, wherein the top memory bank block and the bottom memory bank block are controlled separately in data reed/write operations at least since the top and bottom write control signals are capable of being generated separately independent of each other.

2. The Rambus DRAM of claim 1, wherein the top memory bank block comprises:
   a top DQA memory bank block including 9 unit memory banks controlled by data signal received through DQ pin A; and
   a top DQB memory bank block including 9 unit memory banks controlled by data signal received through DQ pin B and the bottom memory bank block comprises:
      a bottom DQA memory bank block including 9 unit memory banks controlled by data signal received through DQ pin A; and
      a bottom DQB memory bank including 9 unit memory banks controlled by data signal received through DQ pin B.

3. The Rambus DRAM of claim 1, wherein the data write control signal generation block comprises:
   a first data write control signal generation block for receiving data write control signal writeD0123 and generating a top data write control signal writeD0123_top and a bottom data write control signal writeD0123_bot respectively, by a top data write enable signal write_en_top and a bottom data write enable signal write_en_bot; and a second data write control signal generation block for receiving a data write control signal writeD4567 and generating a top data write control signal writeD4567__top and a bottom data write control signal writeD4567__bot , respectively by the top data write enable signal write__en__top and the bottom data write enable signal write__en__bot.

4. The Rambus DRAM of claim 3, wherein the first data write control signal generation block comprises:

a first NAND gate for 2 input of top data write enable signal write__en__top and data write control signal writeD0123__pre;

a first inverter for inverting output signal of the first NAND gate and generating atop data write control signal writeD0123__top;

a second NAND gate for 2 input of bottom data write enable signal write__en__bot and the data write control signal writeD0123__pre; and a second inverter for inverting output signal of the second NAND gate and generating a bottom data write control signal writeD0123__bot.

5. The Rambus DRAM of claim 3, wherein the second data write control signal generation block comprises:

a third NAND gate for 2 input of top data write enable signal write__en__top and data write control signal writeD4567__pre;

a third inverter for inverting output signal of the third NAND gate and generating a top data write control signal writeD4567__top;

a fourth NAND gate for 2 input of bottom data write enable signal write__en__bot and the data write control signal writeD4567__pre; and a fourth inverter for inverting output signal of the fourth NAND gate and generating a bottom data write control signal writeD4567__bot.

6. The Rambus DRAM of claim 5, wherein the top data write enable signal generation block comprises:

a first flip flop for inputting a top write clock signal sclk__en__top and a clock signal rclk;

a second flip flop for inputting output signal of the first flip flop and the clock signal rclk;

a third flip flop for inputting output signal of the second flip flop and the clock signal rclk;

a fourth flip flop for inputting output signal of the third flip flop and the clock signal rclk;

a fifth flip flop for inputting output signal of the fourth flip flop and the clock signal rclk;

a sixth flip flop for inputting output signal of the fifth flip flop and the clock signal rclk; and a fifth NAND gate for 2 input of the top write clock signal sclk__en__top and output signal of the sixth flip flop to generate the tap data write enable signal write__top.

7. The Rambus DRAM of claim 5, wherein the bottom data write enable signal generation block comprises:

a seventh flip flop for inputting a bottom write clock signal sclk__en__bot and a clock signal rclk;

an eighth flip flop for inputting output signal of the seventh flip flop and the clock signal rclk;

a ninth flip flop for inputting output signal of the eighth flip flop and the clock signal rclk;

a tenth flip flop for inputting output signal of the ninth flip flop and the clock signal rclk;

an eleventh flip flop for inputting output of the tenth flip flop and the clock signal rclk;

a twelfth flip flop for inputting output of the eleventh flip flop and the clock signal rclk; and a sixth NAND gate for 2 input of the bottom write clock signal sclk__en__bot and output signal of the twelfth flip flop to generate the bottom data write enable signal write__bot.

8. The Rambus DRAM of claim 1, wherein the data read control signal generation block comprises:

a seventh NAND gate for 2 input of top bank selection signal top__bank__sel__4f and data read control signal loadRDpipe__pre;

a fifth inverter for inverting output signal of the seventh NAND gate and generating the top data read control signal loadRDpipe__top;

an eighth NAND gate for 2 input of bottom bank selection signal bot__bank__sel__4f and data read control signal loadRDpipe__pre; and a sixth inverter for inverting output signal of the eighth NAND gate and generating the bottom data read control signal loadRDpipe__bot.

9. The Rambus DRAM of claim 8, wherein a circuit for generating the top bank selection signal top__bank__sel__4f and the bottom bank selection signal bot__bank__sel__4f comprises:

a thirteenth flip flop for inputting top bank selection signal top__bank__sel and a clock signal rclk;

a fourteenth flip flop for inputting output signal of the thirteenth flip flop and the clock signal rclk;

a fifteenth flip flop for inputting output signal of the fourteenth flip flop and the clock signal rclk;

a sixteenth flip flop for inputting output signal of the fifteenth flip flop and the clock signal to generate the top bank selection signal top__bank__sel__4f;

a seventh inverter for inputting the top bank selection signal top__bank__sel__f4 outputted from the sixteenth flip flop and generating bottom bank selection signal bot__bank__sel__f4; and an eighth inverter for inputting the top bank selection signal top__bank__sel__4f outputted from the fourteenth flip flop and generating bottom bank selection signal bot__bank__sel__2f.

10. The Rambus DRAM of claim 9, wherein a circuit for generating the top and bottom data read control signals comprises:

a ninth NAND gate for 2 input of top bank selection signal top__bank__sel__2f and data read clock signal load__outpipe__pre;

a ninth inverter for receiving output signal of the ninth NAND gate and generating the top data read clock signal load__outpipe__top;

a top data read control signal generation block for receiving the top data read clock signal load__outpipe__top outputted from the ninth inverter and generating a top data read control signal drainRDpipe__top;

a tenth NAND gate for 2 input of bottom bank selection signal bot__bank__sel__2f and data read clock signal load__outpipe__pre;

a tenth inverter for receiving output signal of the tenth NAND gate and outputting the bottom data read clock signal load__outpipe__bot; and a bottom data read control signal generation block for receiving the bottom data read clock signal load__outpipe__bot outputted from the tenth inverter and generating a bottom data read control signal drainRDpipe__bot.

11. A Rambus DRAM comprising:
a top and a bottom memory bank blocks, each including a plurality of memory banks; and
a data read/write control signal generation block for generating a top data write control signal and a top data read control signal to the top memory bank block and a bottom data write control signal and a bottom data read control signal to the bottom memory bank block, thereby controlling the top memory bank block and the bottom memory bank block to separately operate in data read/write operations,
wherein the data write control signal generation block comprises:
a first data write control signal generation block for receiving data write control signal writeD0123 and generating a top data write control signal writeD0123_top and a bottom data write control signal writeD0123_bot respectively, by a top data write enable signal write_en_top and a bottom data write enable signal write_en_bot; and
a second data write control signal generation block for receiving a data write control signal writeD4567 and generating a top data write control signal writeD4567_top and a bottom data write control signal writeD4567_bot, respectively by the top data write enable signal write_en_top and the bottom data write enable signal write_en_bot.

12. The Rambus DRAM of claim 11, wherein the first data write control signal generation block comprises:
a first NAND gate for 2 input of top data write enable signal write_en_top and data write control signal writeD0123_pre;
a first inverter for inverting output signal of the first NAND gate and generating a top data write control signal writeD0123_top;
a second NAND gate for 2 input of bottom data write enable signal write_en_bot and the data write control signal writeD0123_pre; and a second inverter for inverting output signal of the second NAND gate and generating a bottom data write control signal writeD0123_bot.

13. The Rambus DRAM of claim 11, wherein the second data write control signal generation block comprises:
a third NAND gate for 2 input of top data write enable signal write_en_top and data write control signal writeD4567_pre;
a third inverter for inverting output signal of the third NAND gate and generating a top data write control signal writeD4567_top;
a fourth NAND gate for 2 input of bottom data write enable signal write_en_bot and the data write control signal writeD4567_pre; and
a fourth inverter for inverting output signal of the fourth NAND gate and generating a bottom data write control signal writeD4567_bot.

14. The Rambus DRAM of claim 13, wherein the top data write enable signal generation block comprises:
a first flip flop for inputting a top write clock signal sclk_en_top and a clock signal rclk;
a second flip flop for inputting output signal of the first flip flop and the clock signal rclk;
a third flip flop for inputting output signal of the second flip flop and the clock signal rclk;
a fourth flip flop for inputting output signal of the third flip flop and the clock signal rclk;
a fifth flip flop for inputting output signal of the fourth flip flop and the clock signal rclk;
a sixth flip flop for inputting output signal of the fifth flip flop and the clock signal rclk; and
a fifth NAND gate for 2 input of the top write clock signal sclk_en_top and output signal of the sixth flip flop to generate the top data write enable signal write_top.

15. The Rambus DRAM of claim 13, wherein the bottom data write enable signal generation block comprises:
a seventh flip flop for inputting a bottom write clock signal sclk_en_bot and a clock signal rclk;
an eighth flip flop for inputting output signal of the seventh flip flop and the clock signal rclk;
a ninth flip flop for inputting output signal of the eighth flip flop and the clock signal rclk;
a tenth flip flop for inputting output signal of the ninth flip flop and the clock signal rclk;
an eleventh flip flop for inputting output of the tenth flip flop and the clock signal rclk;
a twelfth flip flop for inputting output of the eleventh flip flop and the clock signal rclk; and
a sixth NAND gate for 2 input of the bottom write clock signal sclk_en_bot and output signal of the twelfth flip flop to generate the bottom data write enable signal write_bot.

16. A Rambus DRAM comprising:
a top and a bottom memory bank blocks, each including a plurality of memory banks; and
a data read/write control signal generation block for generating a top data write control signal and a top data read control signal to the top memory bank block and a bottom data write control signal and a bottom data read control signal to the bottom memory bank block, thereby controlling the top memory bank block and the bottom memory bank block to separately operate in data read/write operations,
wherein the data read control signal generation block comprises:
a seventh NAND gate for 2 input of top bank selection signal top_bank_sel_4f and data read control signal loadRDpipe_pre;
a fifth inverter for inverting output signal of the seventh NAND gate and generating the top data read control signal loadRDpipe_top;
an eighth NAND gate for 2 input of bottom bank selection signal bot_bank_sel_4f and data read control signal loadRDpipe_pre; and
a sixth inverter for inverting output signal of the eighth NAND gate and generating the bottom data read control signal loadRDpipe_bot.

17. The Rambus DRAM of claim 16, wherein a circuit for generating the top bank selection signal top_bank_sel_4f and the bottom bank selection signal bot_bank_sel_4f comprises:
a thirteenth flip flop for inputting top bank selection signal top_bank_sel and a clock signal rclk;
a fourteenth flip flop for inputting output signal of the thirteenth flip flop and the clock signal rclk;
a fifteenth flip flop for inputting output signal of the fourteenth flip flop and the clock signal rclk;
a sixteenth flip flop for inputting output signal of the fifteenth flip flop and the clock signal to generate the top bank selection signal top_bank_sel_4f;

a seventh inverter for inputting the top bank selection signal top_bank_sel_f4 outputted from the sixteenth flip flop and generating bottom bank selection signal bot_bank_sel_f4; and an eighth inverter for inputting the top bank selection signal top_bank_sel_4f outputted from the fourteenth flip flop and generating bottom bank selection signal bot_bank_sel_2f.

18. The Rambus DRAM of claim 17, wherein a circuit for generating the top and bottom data read control signals comprises:

a ninth NAND gate for 2 input of top bank selection signal top_bank_sel_2f and data read clock signal load_outpipe_pre;

a ninth inverter for receiving output signal of the ninth NAND gate and generating the top data read clock signal load_outpipe_top;

a top data read control signal generation block for receiving the top data read clock signal load_outpipe_top outputted from the ninth inverter and generating a top data read control signal drainRDpipe_top;

a tenth NAND gate for 2 input of bottom bank selection signal bot_bank_set_2f and data read clock signal load_outpipe_pre;

a tenth inverter for receiving output signal of the tenth NAND gate and outputting the bottom data read clock signal load_outpipe_bot; and a bottom data read control signal generation block for receiving the bottom data read clock signal load_outpipe_bot outputted from the tenth inverter and generating a bottom data read control signal drainRDpipe_bot.

* * * * *